(12) United States Patent
Huang et al.

(10) Patent No.: US 9,197,199 B2
(45) Date of Patent: Nov. 24, 2015

(54) LEVEL SHIFTER FOR HIGH DENSITY INTEGRATED CIRCUITS

(71) Applicant: Taiwan Semiconductor Manufacturing Co., Ltd., Hsin-Chu (TW)

(72) Inventors: Tien-Chien Huang, Hsinchu (TW); Ruey-Bin Sheen, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/833,975

(22) Filed: Mar. 15, 2013

(65) Prior Publication Data

US 2014/0266386 A1    Sep. 18, 2014

Related U.S. Application Data

(60) Provisional application No. 61/778,479, filed on Mar. 13, 2013.

(51) Int. Cl.
*H03L 5/00* (2006.01)
*H03K 3/356* (2006.01)
*H03K 3/012* (2006.01)

(52) U.S. Cl.
CPC ............ *H03K 3/35613* (2013.01); *H03K 3/012* (2013.01)

(58) Field of Classification Search
CPC ....................................................... H05L 5/00
USPC ................... 326/80–81, 61–63; 327/306, 333
See application file for complete search history.

(56) References Cited

U.S. PATENT DOCUMENTS

| | | | |
|---|---|---|---|
| 6,472,924 B1 | 10/2002 | Takenaka | |
| 6,578,185 B1 | 6/2003 | Kelly | |
| 6,580,291 B1 * | 6/2003 | Lutley | 326/81 |
| 6,628,149 B2 | 9/2003 | Ajit | |
| 7,230,475 B2 * | 6/2007 | Choi et al. | 327/544 |
| 7,375,555 B1 | 5/2008 | Wang et al. | |
| 7,733,159 B1 | 6/2010 | Camarota et al. | |

(Continued)

FOREIGN PATENT DOCUMENTS

KR   10-2005-0054536   6/2005

OTHER PUBLICATIONS

Official Action issued Mar. 27, 2015 in counterpart Korean Patent Application No. 10-2013-0103810.

(Continued)

*Primary Examiner* — Dinh Le

(74) *Attorney, Agent, or Firm* — Duane Morris LLP

(57) ABSTRACT

A level shifter for converting between voltages of a core voltage range to voltages within a larger I/O voltage range. The level shifter has interconnected transistors implemented as core devices operable within the core voltage range. The level shifter is connected to first and second power connections at the I/O voltage range. A voltage clamping element implemented as a core device has a threshold voltage greater than or equal to the difference between the I/O voltage range and the core voltage range and configured to prevent overstressing the transistors with voltages beyond the core voltage range. The input to the level shifter is within the core voltage range. The level shifter output signal has a high level at the high voltage of the I/O voltage range and a low level at approximately one threshold voltage above the low voltage level of the core voltage range.

18 Claims, 4 Drawing Sheets

(56) References Cited

U.S. PATENT DOCUMENTS

| | | | |
|---|---|---|---|
| 8,115,533 B2* | 2/2012 | Kim | 327/333 |
| 8,169,234 B1* | 5/2012 | Bourstein | 326/81 |
| 8,183,884 B2* | 5/2012 | Jung | 326/82 |
| 8,217,685 B2 | 7/2012 | Scott et al. | |
| 8,493,122 B1 | 7/2013 | Chaudhry et al. | |
| 2002/0017940 A1 | 2/2002 | Fujii et al. | |
| 2005/0122820 A1 | 6/2005 | Choi et al. | |
| 2010/0026366 A1 | 2/2010 | Wang et al. | |
| 2011/0298494 A1 | 12/2011 | Bringivijayaraghavan et al. | |
| 2013/0169339 A1* | 7/2013 | Chen | 327/333 |

OTHER PUBLICATIONS

Notice of Allowance from Korean corresponding Application 10-2013-0103810 with translation.

* cited by examiner

LEVEL SHIFTER FOR HIGH DENSITY INTEGRATED CIRCUITS

CROSS-REFERENCE TO RELATED APPLICATION

This application claims priority under 35 U.S.C. §119(e) from Provisional Application Ser. No. 61/778,479, filed Mar. 13, 2013, the entirety of which is hereby incorporated by reference herein.

FIELD

This disclosure relates to circuits generally, and more specifically to level shifters used with a high density integrated circuit such as a system-on-a-chip ("SOC") and/or a 3D integrated circuit ("3D IC").

BACKGROUND

In various high density integrated circuit contexts, some components, such as analog or radiofrequency ("RF") circuits are not located on a main die of the integrated circuit, sometimes designated a SOC main die. Typically, there are only high speed digital circuits on a SOC main die, such as standard cell, SRAM, digital PLL, and high speed memory input/output ("I/O"). Core devices are devices that are formed on such a die to provide high speed digital circuits, and generally operate faster, use lower voltages, have higher density, and are more susceptible to being overstressed and damaged.

I/O needs of a system typically deal with transferring signals between integrated circuit dies and component connections having large capacitances, such as those associated with printed circuit board traces, cables etc. that require larger driving power and voltage than the signaling occurring within the integrated circuit die. I/O devices interface the faster, smaller signals of a main die to these other, higher capacitance components, and typically transfer the signals at higher voltages.

The semiconductor standards body JEDEC provides at least two specifications pertaining to I/O for 3D IC applications, namely Wide I/O and Wide I/O 2, which are generally referred to herein collectively as Wide I/O. The Wide I/O specifications are directed to wide I/O applications having SDRAM (monolithic density) devices with thousands of wide I/O channels using direct chip-to-chip attachment methods between memory devices and a controller device. In Wide I/O, the power supply for data input/output buffers is specified at 1.2V±5%. Core devices on a typical main die, however, operate at a lower voltage, for example, 0.9 V and may be overstressed if operated at the I/O voltage level.

In various contexts, there is a need to provide a level shifter for the I/O demands of high density integrated circuits, such as those found in SOC and 3D IC applications.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms and depictions concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms and depictions concerning electrical coupling and the like, such as "coupled," "connected" and "interconnected," refer to a relationship wherein structures communicate with one another either directly or indirectly through intervening structures unless expressly described otherwise. Similarly, terms and depictions concerning connection points in a circuit such as "pad", "rail", or "terminal" should be understood as inclusive of all forms of electronic connection and are not limited to a physically identifiable pad, rail, or terminal unless expressly described otherwise.

In various embodiments, the core devices may be implemented as part of a foundry process specified for a specific size and transistor density. For example, methods of manufacturing exist for high density integrated circuits suitable for applications such as networking, tablets, and mobile consumer products.

Such foundry processes have a core voltage (Vdd) different to the typical I/O voltage (Vddq). For example, in some embodiments the core voltages can be approximately 0.85 V, 0.9 V, 1.0 V, 1.05 V, and the like, whereas typical I/O voltages are higher. For example, in some embodiments the I/O voltage is 1.8 V I/O and includes under and over drive variations, for example 1.8V UD 1.2V, 1.8V UD 1.5V. In other embodiments, the I/O voltage is 2.5 V I/O and includes under and overdrive variations such as 2.5V UD 1.8V, 2.5V OD 3.3V. In further embodiments, the I/O voltage is the 1.2V±5% specified by JEDEC for Wide I/O or Wide I/O 2. The core and I/O voltages stated in this disclosure are exemplary in nature, and other voltages are contemplated within the scope of the disclosure.

In some embodiments, the disclosed level shifter is implemented and modeled using a process that operates over a core voltage range specified with a high voltage level of Vdd at 0.9V±10% and a low voltage level of Vss at a ground of 0 V.

Figure 1:
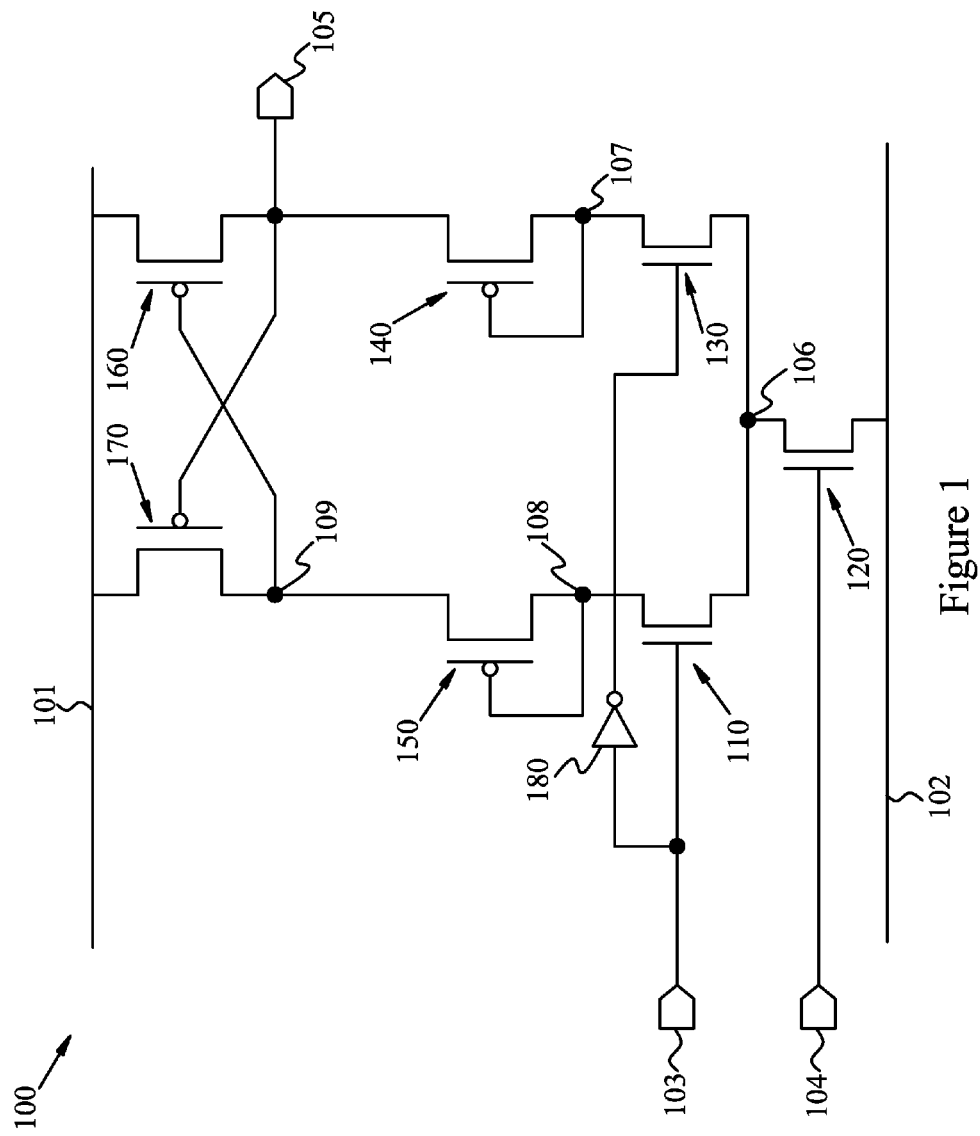
FIG. 1 is a diagram of a level shifter implemented using core device MOSFETs.

FIG. 1 is a diagram of a level shifter 100 implemented using core device MOSFETs in accordance with some embodiments. In this example, the level shifter 100 is designed as a core device operating with core voltages of Vdd at 0.9 V±10% and Vss at a ground of 0 V. Level shifter 100 receives power via a first power connection from a first voltage supply, Vddq rail 101, that supplies power at 1.2 V±5%. Level Shifter 100 is connected via a second power connection to a second voltage supply, Vss rail 102, at a ground of 0 V. In various alternative embodiments, Vss and/or Vssq may be at true ground, 0 V, a common reference voltage, or at different reference voltages.

Figure 3:
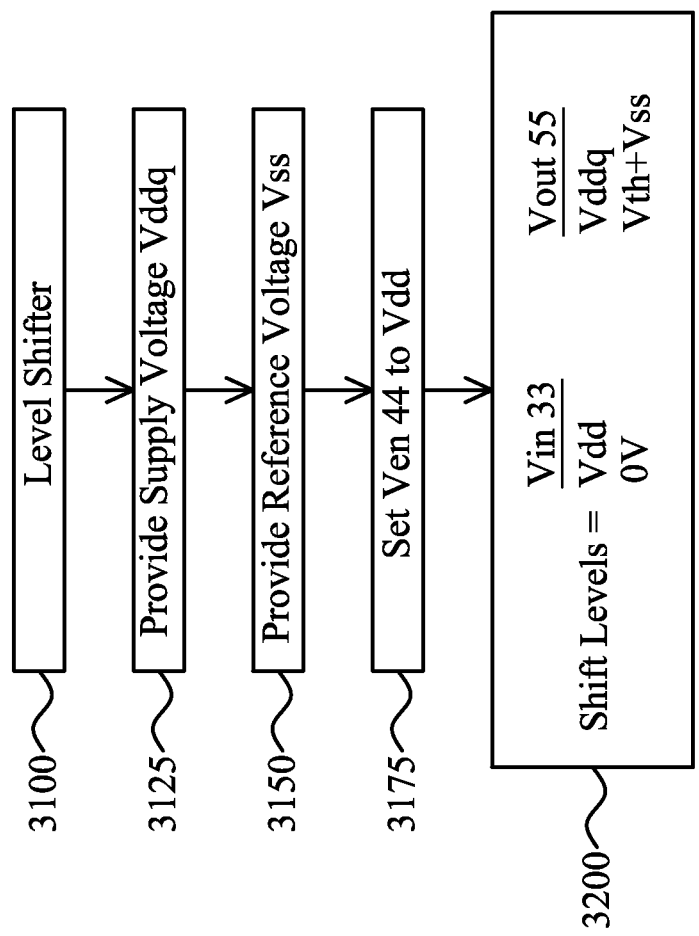
FIG. 3 is a flow diagram illustrating operation of the level shifter shown in FIG. 1.
Figure 4:
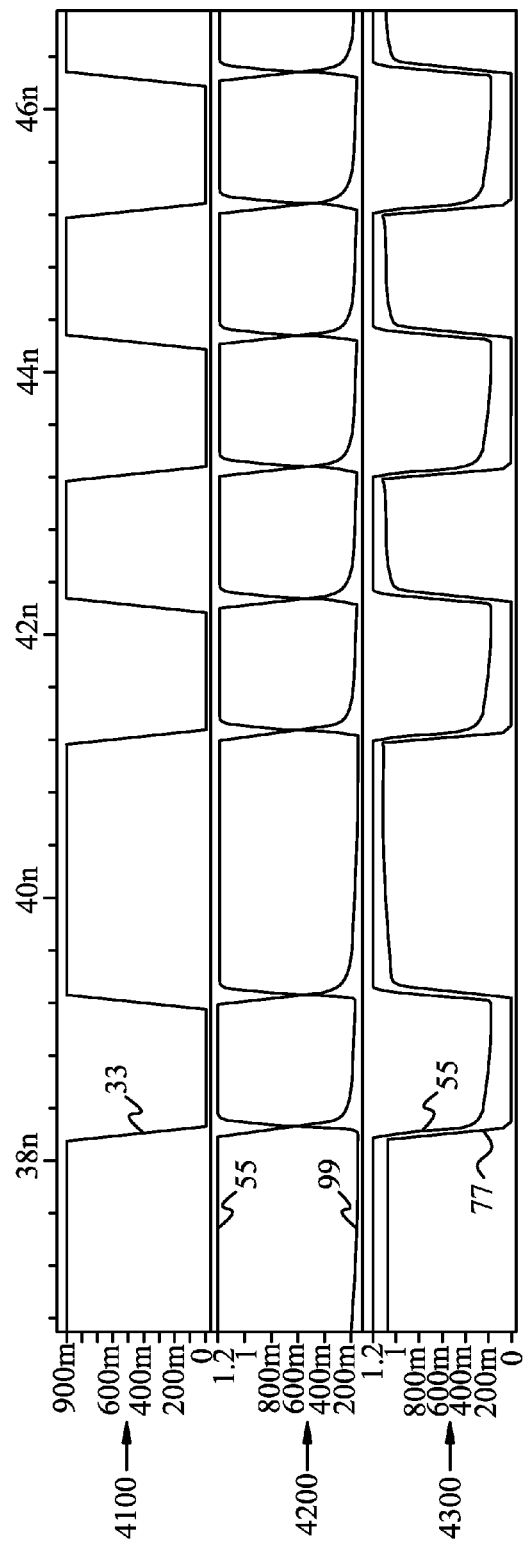
FIG. 4 shows waveforms modeling the operation of the level shifter shown in FIG. 1.

FIGS. 3 and 4, discussed further below, illustrate examples of voltage signals Vin 33, Ven 44, Vout 55, Voutb 99 and Vnd 77. Referring to FIGS. 1, 3 and 4, level shifter 100 has input connection 103 for receiving voltage input signal Vin 33 (FIGS. 3, 4), an enable connection 104 for receiving enable signal Ven 44 (FIGS. 3, 4), and an output connection 105 for providing voltage output signal Vout 55 (FIGS. 3, 4). Level shifter 100 has connection nodes 106, 107, 108 and 109. Voltage level signal designated Vnd 77 (FIG. 4) is the voltage at connection node 107. Voltage level signal designated Voutb 99 (FIG. 4) is the voltage at connection node 109. Output pad 105 serves as an output connection for providing output voltage Vout 55 (FIGS. 3,4) within an I/O voltage range. As will be appreciated by one of ordinary skill in the art in view of the description and accompanying figures, components and voltage levels designated with a "b" are symmetric and complimentary to the corresponding component or voltage level.

As shown in FIG. 1, level shifter has a plurality of MOS core devices connected between Vddq rail 101 and Vss rail 102. In this example, the I/O voltage is defined with a high voltage of 1.2 V±5% and a low voltage of ground. The I/O voltage of 1.2 V±5% is greater than the core voltage range discussed previously, and if the full 1.2 V±5% were to be applied across one of the core device transistors, the transistors would be overstressed, decreasing reliability and potentially resulting in failed operation and permanent damage.

In the embodiment shown, there are three NMOS core devices 110, 120 and 130 and four PMOS core devices 140, 150, 160 and 170. The MOS core devices are connected as follows.

NMOS core device 110, also designated MNDB, has its gate terminal connected to input connection 103 and input terminal of inverter 180, its drain terminal connected to the drain and gate of PMOS core device 150 at node 108, and its source terminal connected to the drain terminal of NMOS core device 120 at node 106. Inverter 180 is implemented as a core device.

NMOS core device 120, also designated MNS, has its gate terminal connected to enable connection 104, its drain terminal connected to the source terminals of NMOS core devices 110, 130 at node 106, and its source terminal connected to Vss rail 102.

NMOS core device 130, also designated MND, has its gate terminal connected to the output of inverter 180, its source terminal connected to node 106, and its drain terminal connected to the gate and drain terminal of PMOS core device 140 at node 107.

PMOS core device 140, also designated MPI, has its gate terminal shorted to its drain terminal, both connected to the drain terminal of NMOS 130 at node 107, its source terminal connected to the drain terminal of PMOS core device 160 and the gate of PMOS core device 170 at the node having output connection 105.

PMOS core device 150, also designated MPIB, has its gate terminal shorted to its drain terminal, both connect to the drain terminal of NMOS core device 110 at node 108, its source terminal connected to the drain terminal of PMOS core device 170 and the gate terminal of PMOS core device 160 at node 109.

PMOS core device 160, also designated MPU, has its gate terminal connected to the drain terminal of PMOS core device 170 and the source terminal of PMOS core device 150 at node 109, its drain terminal connected to the gate terminal of PMOS core device 170 and the source terminal of PMOS core device 140 at the node having output connection 105, and its source terminal connected to Vddq rail 101.

PMOS core device 170, also designated MPUB, has its gate terminal connected to the drain terminal of PMOS core device 160 and the source terminal of PMOS core device 140 at the node having output connection 105, its drain terminal connected to the gate terminal of PMOS core device 160 and the source terminal of PMOS core device 150 at node 109, and its source terminal connected to Vddq rail 101.

Level shifter 100 is implemented using only core devices to convert Vin 33 at a level in the core voltage range to Vout 55 at a corresponding level in the I/O voltage range, with the high level at Vddq and the low level at a predetermined threshold voltage level ("Vth") above Vss.

Level shifter 100 has two cross-coupled MOS core devices, implemented as PMOS core devices 160, 170 cross-coupled with their source terminals connected to Vddq rail 101.

Level shifter 100 has two voltage clamping MOS devices, implemented as two PMOS core devices 140, 150 that have their gate and drain terminals shorted such that they function as a diode and provide a corresponding voltage clamping function according to the threshold voltage ("Vth") characteristic that is predefined for the selected PMOS core devices 140, 150. Advantageously, Vth is selected to be greater than the difference between the high level of the I/O voltage range and the high level of the core voltage range. Typical Vth values for a SVT device would be 0.5 to 0.4 V. In this embodiment, Vth is greater than 1.2V+5% (i.e. 1.26V) less the lowest expected value of Vdd (i.e. 0.9V−10%, or 0.81V). Given the tolerances of Vddq and Vdd, PMOS core devices 140, 150 are selected to have a Vth characteristic of at least 0.45 V. In this example, Vth is 0.5 V. The source terminals of these PMOS core devices are cascaded to the drain terminals of the cross-coupled MOS core devices.

Level shifter 100 has two input MOS core devices implemented as NMOS core devices 130, 110 having their gates connected to input connection 103 for receiving Vin 33, but with inverter 180 inverting the polarity of Vin 33 before applying it to the gate of NMOS core device 130. The drain terminals of the two input MOS core devices being cascaded to the drain terminals of the voltage clamping MOS core devices.

Level shifter 100 further has one enable MOS core device implemented as NMOS core device 120, having its gate connected to enable connection 104 for receiving Ven 44. NMOS core device 120 having its source connected to Vss and its drain connected to the input MOS core devices, providing a limit on leakage current.

In operation, level shifter 100 converts Vin 33 (at core operating voltages) to Vout 55 (at I/O voltages between high, Vddq, and low, Vth above Vss). Ven 44 is set high such that NMOS core device 120 is turned on, thus Vns 66 is approximately 0 V due to connection to Vss rail 102. In the enabled state, level shifter 100 will now be described for a pull down of Vout 55, which is initiated by transitioning Vin 33 low, i.e., transitioning Vin 33 from high, Vdd, to low, 0 V. For a pull up event, the circuit operates in a symmetric and complimentary fashion that will be understood from the description of the pull down event.

When Vin 33 transitions low, NMOS core device 110 is cutoff and the output of inverter 180 applies a high (Vdd) voltage to the gate of NMOS core device 130, turning it on and driving Vnd 77 to near 0 V by virtue of connection through to Vss rail 102. Initially, Vout 55 is at 1.2 V and so the voltage difference across PMOS core device 140 is about that amount. As Vnd 77 goes to near 0 V, PMOS core device 140 will turn on and begin pulling Vout 55 down towards Vnd 77. Because it is connected as a diode, however, PMOS core device 140 will turn off once the difference between its source voltage (Vout 55) and its drain voltage (Vnd 77) is less than or equal to its Vth. As such, once Vout is pulled down to Vth plus Vnd 77, PMOS core device 140 will turn off, and Vout will be constrained to the voltage of Vth over Vnd 77. Because Vnd 77 is at or near 0 V, Vout is constrained to simply Vth. The voltage difference across PMOS core device 160 in this state is Vddq (1.2 V±5%) minus Vth. For example, for Vddq of 1.2

V and a Vth of 0.4 V, PMOS core device 160 would be stressed with about 0.8 Vds, which is not an overstress condition.

Figure 2:
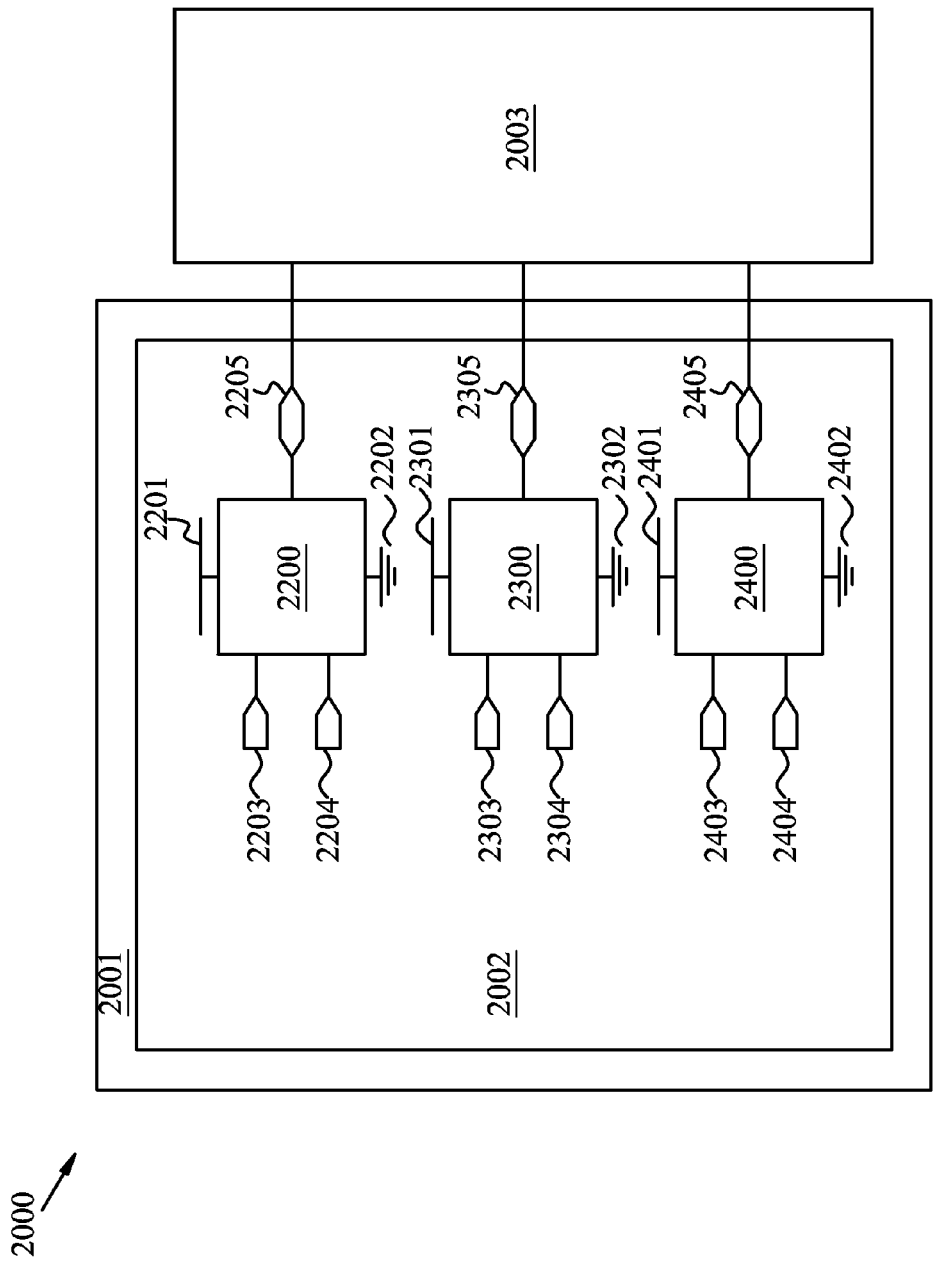
FIG. 2 is a diagram of a system using a plurality of the level shifters shown in FIG. 1.

FIG. 2 is a diagram of an electronic system 2000 having integrated circuit silicon die 2001 and an off-core circuit 2003 disposed off of the integrated circuit silicon die 2001. In some embodiments, the circuits are connected using direct chip-to-chip attachment methods. Electronic system 2000 has a core circuit 2002 disposed on the integrated circuit silicon die 2001 and includes a plurality of core devices operating with core voltages Vdd and Vss, as described with respect to FIG. 1.

The core devices include a plurality of level shifters 2200, 2300, 2400. Level shifter 2200 has input voltage connection 2203, enable connection 2204, output voltage connection 2205, and is connected to Vddq rail 2201, and Vss rail 2202, as discussed for level shifter 100 with reference to FIG. 1. It will be understood that a physical pad need not be present at output connection 2205 and connections may be made by traces and other conventional means of connection. Level shifters 2300 and 2400 have similar connections using similar reference numerals. The internal components of each of the level shifters are as shown and described with respect to FIG. 1. Three level shifters are shown in FIG. 2 for illustrative purposes only. In actuality, system 2000 has an extensive array of level shifters, not shown for practical purposes. The level shifters couple the core circuit 2002 to the off core circuit 2003. Advantageously, the output of each level shifter may be applied to one or more input connection of a core devices only post driver, as disclosed in patent application U.S. Ser. No. 13/778,380, filed Feb. 27, 2013, the entirety of which is hereby incorporated by reference. In some such embodiments (not shown), a core devices only post driver is disposed on integrated circuit silicon die 2001, and may be part of core circuit 2002, between the level shifters 2200, 2300, and 2400 and off-core circuit 2003.

FIG. 3 is a flow diagram showing operation of level shifter 100 shown in FIG. 1. In step 3100, level shifter 100 is provided as shown and described with respect to FIG. 1. In step 3125, a high voltage of 1.2 V±5% is supplied to the Vddq rail 101. In step 3150, a low reference voltage of Vss is supplied to rail 102.

In step 3175, enable signal Ven 44 applied to enable connection 104 is set to high, which is Vdd. When Ven 44 is set to low, NMOS core device is in the cutoff region, disabling level shifter 100.

In step 3200, input voltage signal Vin 33 is applied to first connection 103, the voltage signal having a high level of Vdd and a low level of Vss. Operational, level shifter 100 outputs Vout 55 at corresponding high level of Vddq and low level of Vth above Vss.

FIG. 4 shows waveforms modeled for the operation of level shifter 100. The waveforms are shown with amplitude in volts and milivolts (as indicated) as a function of time in nanoseconds. FIG. 4 depicts the modeled operation of level shifter 100 with Ven 44 set to high, and is modeled under a typical process corner, using typical typical corners, 1×Vdd, and 25° C. Graph 4100 of FIG. 4 shows input waveform for Vin 33. Graph 4200 shows Vout 55 and Voutb waveforms resulting from the input waveform shown in graph 4100. Graph 4300 shows Vout 55 waveform compared to Vnd 77, which is the voltage clamping waveform at node 107. Graph 4300 confirms that the difference between Vout 55 and Vnd 77 is constrained to the threshold voltage of PMOS core device 140, indicating that the description of the circuit behavior holds true and that none of the MOS core devices are overstressed even while operating between rails at 0 V and Vddq.

Without the voltage clamping elements 140, 150, Vout may be as low as 0 V, overstressing PMOS core device 160 with a Vds of Vddq (1.2 V±5%). Likewise, when Vout is Vddq, NMOS 130 would be overstressed with a Vds of the full value of Vddq. Complementary MOS devices 170, 110 would similarly be overstressed in the complimentary states. Voltage clamping elements 140, 150 advantageously prevent overstressing the core devices. As depicted in graph 4300, the modeled waveforms for level shifter 100 confirm Vout ranging from Vddq to Vth. As such, the model depicted in FIG. 4 indicates that level shifter 100 will not overstress the MOS core devices during operation even though the level shifter is using I/O voltages outside of the operating range of the core devices.

Applicants have further calculated voltages at every node and time for operation of level shifter 100 to confirm that the modeled level shifter does not overstress any of the MOS core devices and that it remains sufficiently reliable during various process corners. The calculated process corners include: (a) a typical corner, defined as typical typical, operating at 1×Vdd, and 25° C., (b) a worst case low temperature corner, defined as slow slow, 0.9×Vdd and −40° C., and (c) a maximum leakage corner, defined as fast fast, 1.1×Vdd, and 125° C.

In alternative embodiments, any threshold voltage of MOS core devices can be adopted, with the remainder of the components being adapted according to the description herein. Likewise, the disclosed embodiments may be adapted to any process core devices' maximum operating voltage, using a threshold voltage such that the maximum operating voltage plus the threshold voltage is more than the I/O voltage range. In alternative embodiments, the voltage clamping elements may be replaced with a component that provides a similar voltage clamping Vth, such as a diode or other compressed circuit. In some embodiments, the MOS core devices are implemented as standard threshold voltage transistors (SVT). Depending on design goals, typically leakage and speed, alternative embodiments use MOS cored devices that may be implemented using low threshold voltage transistors (LVT), high threshold voltage transistors (HVT), other available threshold levels, and combinations thereof. As will be appreciated by one of ordinary skill in the art, other embodiments may be implemented using other transistor technologies besides MOSFET. Likewise, complimentary circuits to that shown in FIG. 1 may be developed using complimentary voltages and components. Herein the Vss rail has been described as being connected to a ground of 0 V. The term ground is used to encompass a common reference voltage node, and need not be connected to a true ground. In alternative embodiments Vss and Vssq are connected to a common voltage domain. Alternatively, Vssq may be interchanged with Vss in some embodiments. In alternative embodiments, the low voltage level of the I/O voltage range and/or the core voltage range may be at some other reference voltage level, including negative voltages. In alternative embodiments, level shifter 100 converts down input signals using an I/O voltage range to core operating voltages, and outputs signals at core voltages for use by other core devices. One of ordinary skill in the art will appreciate that design variations may be made to meet particular speed, driving and reliability requirements for a given I/O problem, specification or design parameter.

Compared to alternative techniques, various embodiments allow I/O devices useable with a SOC or 3D IC die to be developed with reduced tapeout mask costs, fabrication times, and required circuit area. For example, implementing the level driver using core devices instead of larger components disposed off-die in traditional I/O devices results in a savings of fabrication time. Benefits are on a per I/O channel basis, and multiply with the number of level shifters implemented in a given system. Certain embodiments can reduce 4 to 5 times the tapeout mask costs. Various embodiments allow a core devices level shifter useable with a SOC or 3D IC die without requiring provision of an extra middle-bias-voltage at each I/O cell, resulting in reduced required area, power and stability concerns. Porting benefits are likewise increased during process migration because core devices typically see a better shrink factor than off-die I/O devices.

Certain embodiments advantageously do not require additional electrostatic discharge ("ESD") protection devices. For example, if a new extra middle-bias-voltage were required to implement a core devices level shifter, an additional ESD protection device would need to be interconnected between the middle-bias-voltage and each of the existing voltage rails, Vdd, Vss, Vddq, and Vssq, which would consequently weaken the ESD network.

In certain aspects and embodiments, a level shifter, a system using a level shifter, and a method of operating a level shifter are disclosed. In a first aspect, disclosed is a level shifter for converting between voltages within a core voltage range to voltages within an I/O voltage range that is greater than the core voltage range. The level shifter has a plurality of interconnected transistors implemented as core devices adapted to operate at voltages within the core voltage range. The level shifter has an input connection for providing the plurality of interconnected transistors with an input signal having a voltage within the core voltage range. An output connection is coupled to the plurality of interconnected transistors. A first power connection is for coupling the plurality of interconnected transistors to a first voltage supply at the high voltage level of the I/O voltage range and a second power connection is for coupling the plurality of interconnected transistors to a second voltage supply at the low voltage level of the core voltage range. The level shifter has a voltage clamping element having a threshold voltage greater than or equal to the difference between the I/O voltage range and the core voltage range. The voltage clamping element is coupled to prevent overstressing the plurality of interconnected transistors with voltages beyond the core voltage range. The voltage clamping element and the plurality of interconnected transistors are configured to provide a high output signal to the output connection that is at the high voltage level of the I/O voltage range and a low output signal to the output connection that is approximately one threshold voltage above the low voltage level of the core voltage range.

In a second aspect, a system has at least one integrated circuit silicon die. The system has an off-core circuit disposed off of the integrated circuit silicon die and a core circuit disposed on the integrated circuit silicon die. The core circuit includes a plurality of core devices adapted to operate over a core voltage range, including a plurality of level shifters for coupling the core circuit to the off core circuit. The level shifters are implemented using core devices adapted to operate over the core voltage range, at least one of the level shifters implemented as described with respect to the first aspect.

In a third aspect, disclosed is a method of operating a level shifter adapted to convert between voltages within a core voltage range to voltages within an I/O voltage range that is greater than the core voltage range. The method includes providing a level shifter having a plurality of interconnected transistors implemented as core devices adapted to operate at voltages within the core voltage range. The provided level shifter further having an input connection, an output connection, a first power connection, a second power connection, and a voltage clamping element. The voltage clamping element has a threshold voltage greater than or equal to the difference between the I/O voltage range and the core voltage range. The voltage clamping element is coupled to prevent overstressing the plurality of interconnected transistors with voltages beyond the core voltage range. The method further includes supplying the high voltage of the I/O voltage range to the first power connection and supplying the low voltage of the I/O voltage range to the second power connection. The method includes applying an input signal to the first input connection within a high level at the high voltage level of the core voltage range and a low level at the low voltage level of the core voltage range. An output signal is received from the level shifter that is within a high level at the high voltage level of the I/O voltage range and a low level at one threshold voltage above the low voltage level of the core voltage range.

In some embodiments, the voltage clamping element is one of a pair of voltage clamping elements, and the plurality of interconnected transistors includes a pair of input transistors and a pair of cross-coupled transistors. The pair of input transistors is connected respectively in cascade between the second power connection and the pair of voltage clamping elements and has a core device inverter connected between the input connection of the level shifter and one of the input transistors. The pair of cross-coupled transistors is connected respectively in cascade between the voltage clamping elements and the first power connection. In some embodiments, the pair of input transistors are NMOS core devices and the pair of cross-coupled transistors are PMOS core devices.

In some embodiments, the plurality of interconnected transistors includes an enable transistor connecting the remaining transistors in the plurality with one of the first and second power connections. In some embodiments, the enable transistor is a NMOS core device connecting the remaining transistors in the plurality to the second power connection. In some embodiments, the voltage clamping element is a diode. In some, the voltage clamping element is a MOS core device with its gate and drain terminals shorted together. In certain embodiments, the level shifter is adapted for a wide I/O application.

In some embodiments, the output signal of the level shifter is pulled up by transitioning the input signal to the high voltage of the core voltage range, causing the output signal of the level shifter to transition to the high voltage of the I/O voltage range. In certain embodiments, the output signal of the level shifter is pulled down by transitioning the input signal to the low voltage of the core voltage range, causing the output signal of the level shifter to transition to approximately one threshold voltage above the low voltage of the core voltage range. In some embodiments, the level shifter is enabled by applying an enable signal to an enable connection thereof.

Although the subject matter has been described in terms of exemplary embodiments, it is not limited thereto. Rather, the appended claims should be construed broadly, to include other variants and embodiments, which may be made by those skilled in the art.

What is claimed is:

1. A level shifter for converting between voltages within a core voltage range extending from a high core voltage level to a low core voltage level and voltages within an I/O voltage range extending from a high I/O voltage level to a low I/O voltage level, the I/O voltage range being greater than the core voltage range, the level shifter comprising:
   a plurality of interconnected transistors implemented as core devices adapted to operate at voltages within said core voltage range;

an input connection for providing at least one of said plurality of interconnected transistors with an input signal having a voltage within said core voltage range;

an output connection coupled to said plurality of interconnected transistors;

a first power connection for supplying voltage at the high I/O voltage level to at least two of said plurality of interconnected transistors;

a second power connection for supplying voltage at the low core voltage level to at least two of said plurality of interconnected transistors;

a voltage clamping element implemented as a core device and having a threshold voltage greater than or equal to the difference between the I/O voltage range and the core voltage range, the voltage clamping element coupled to prevent overstressing said plurality of interconnected transistors with voltages beyond said core voltage range, wherein said voltage clamping element and said plurality of interconnected transistors are configured to provide a high output signal to said output connection that is at the high I/O voltage level when said input signal is at the high core voltage level and a low output signal to said output connection that is approximately one said threshold voltage above the low core voltage level when said input signal is at the low core voltage level; and an enable transistor being one of said plurality of interconnected transistors and connecting the remaining transistors in said plurality with one of said first and second power connections.

2. The level shifter of claim 1, wherein said voltage clamping element is one of a pair of voltage clamping elements, and said plurality of interconnected transistors comprises:

a pair of input transistors connected respectively in cascade between said second power connection and said pair of voltage clamping elements and having a core device inverter connected between said input connection and one of the input transistors; and a pair of cross-coupled transistors connected respectively in cascade between said voltage clamping elements and said first power connection.

3. The level shifter of claim 2, wherein the pair of input transistors are NMOS core devices and the pair of cross-coupled transistors are PMOS core devices.

4. The level shifter of claim 1, wherein said enable transistor is a NMOS core device connecting the remaining transistors in said plurality to said second power connection.

5. The level shifter of claim 1, wherein the voltage clamping element is a diode.

6. The level shifter of claim 1, wherein said voltage clamping element is a MOS core device with its gate and drain terminals shorted together.

7. The level shifter of claim 1, wherein said level shifter is adapted for a wide I/O application.

8. A system having an integrated circuit silicon die, the system comprising:

an off-core circuit disposed off of said integrated circuit silicon die and adapted to operate over an I/O voltage range that extends from a high I/O voltage level to a low I/O voltage level;

a core circuit disposed on said integrated circuit silicon die and comprising a plurality of core devices adapted to operate over a core voltage range that extends from a high core voltage level to a low core voltage level, the core circuit including a plurality of level shifters for coupling said core circuit to said off core circuit and implemented using core devices adapted to operate over said core voltage range, the core voltage range being less than the I/O voltage range, at least one level shifter in said plurality of level shifters comprising:

a plurality of interconnected transistors implemented as core devices;

an input connection for providing at least one of said plurality of interconnected transistors with an input signal having a voltage within said core voltage range;

an output connection coupled to said plurality of interconnected transistors;

a first power connection for supplying voltage at the high I/O voltage level to at least two of said plurality of interconnected transistors;

a second power connection for supplying voltage at the low core voltage level to at least two of said plurality of interconnected transistors; and a voltage clamping element having a threshold voltage greater than or equal to the difference between the I/O voltage range and the core voltage range, the voltage clamping element coupled to prevent overstressing said plurality of interconnected transistors with voltages beyond said core voltage range, wherein said voltage clamping element and said plurality of interconnected transistors are configured to provide a high output signal to said output connection that is at the high I/O voltage level when said input signal is at the high core voltage level and a low output signal to said output connection that is approximately one said threshold voltage above the low core voltage level when said input signal is at the low core voltage level.

9. The system of claim 8, wherein said voltage clamping element is one of a pair of voltage clamping elements, and said plurality of interconnected transistors comprises:

a pair of input transistors connected respectively in cascade between said second power connection and said pair of voltage clamping elements, and having a core device inverter connected between the input connection and one of the input transistors; and a pair of cross-coupled transistors connected respectively in cascade between said voltage clamping elements and said first power connection.

10. The system of claim 9, wherein said pair of input transistors are NMOS core devices and the pair of cross-coupled transistors are PMOS core devices.

11. The system of claim 8, wherein said plurality of interconnected transistors further comprises an enable transistor connecting the remaining transistors in said plurality with one of said first and second power connections.

12. The system of claim 11, wherein said enable transistor is a NMOS core device connecting the remaining transistors in said plurality to said second power connection.

13. The system of claim 8, wherein the voltage clamping element is a diode.

14. The system of claim 8, wherein said voltage clamping element is a MOS core device with its gate and drain terminals shorted together.

15. The system of claim 8, wherein said level shifter is adapted for a wide I/O application.

16. A method of operating a level shifter adapted to convert between voltages within a core voltage range that extends from a high core voltage level to a low core voltage level and voltages within an I/O voltage range that extends from a high I/O voltage level to a low I/O voltage level, the I/O voltage range being greater than the core voltage range, the method comprising steps:

providing said level shifter comprising a plurality of interconnected transistors implemented as core devices adapted to operate at voltages within said core voltage range, an input connection, an output connection, a first power connection, a second power connection, an enable connection, and a voltage clamping element having a threshold voltage greater than or equal to the difference between the I/O voltage range and the core voltage range, the voltage clamping element coupled to prevent overstressing said plurality of interconnected transistors with voltages beyond said core voltage range;

supplying voltage at the high I/O voltage level of to said first power connection and at least two of said plurality of interconnected transistors;

supplying voltage at the low core voltage level to said second power connection and at least two of said plurality of interconnected transistors;

applying an enable signal to said enable connection to enable the level shifter;

applying an input signal to said input connection within said core voltage range;

receiving an output signal from said level shifter that is at the high I/O voltage level when said input signal is at said high core voltage level and that is at one said threshold voltage above the low core voltage level when said input signal is at said low core voltage level.

17. The method of claim 16, further comprising the step of pulling up said output signal by transitioning said input signal to the high core voltage level, causing the output signal of said level shifter to transition to the high I/O voltage level.

18. The method of claim 16, further comprising the step of pulling down said output signal by transitioning said input signal to the low core voltage level, causing the output signal of said level shifter to transition to approximately one said threshold voltage above the low core voltage level.

* * * * *